United States Patent
Gondhalekar et al.

(10) Patent No.: US 7,354,501 B2
(45) Date of Patent: *Apr. 8, 2008

(54) UPPER CHAMBER FOR HIGH DENSITY PLASMA CVD

(75) Inventors: Sudhir Gondhalekar, Fremont, CA (US); Tom K. Cho, Palo Alto, CA (US); Rolf Guenther, Monte Sereno, CA (US); Steve H. Kim, Union City, CA (US); Mehrdad Moshfegh, San Jose, CA (US); Shigeru Takehiro, Chiba (JP); Thomas Kring, Sunnyvale, CA (US); Tetsuya Ishikawa, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1004 days.

This patent is subject to a terminal disclaimer.

(21) Appl. No.: 10/150,458

(22) Filed: May 17, 2002

(65) Prior Publication Data
US 2003/0213434 A1 Nov. 20, 2003

(51) Int. Cl.
*C23C 16/00* (2006.01)
*H01L 21/306* (2006.01)
(52) U.S. Cl. .............................. 156/345.48; 118/723 I
(58) Field of Classification Search ............. 118/723 I, 118/723 IR, 723 AN; 156/345.48, 345.49
See application file for complete search history.

(56) References Cited

U.S. PATENT DOCUMENTS

| | | | | |
|---|---|---|---|---|
| 4,264,393 A | * | 4/1981 | Gorin et al. ........... | 156/345.37 |
| 5,280,156 A | * | 1/1994 | Niori et al. .................. | 219/385 |
| 5,695,564 A | * | 12/1997 | Imahashi ..................... | 118/719 |
| 5,858,100 A | * | 1/1999 | Maeda et al. ............... | 118/719 |
| 5,900,103 A | * | 5/1999 | Tomoyasu et al. ..... | 156/345.44 |
| 5,944,902 A | * | 8/1999 | Redeker et al. ....... | 118/723 AN |
| 6,074,512 A | * | 6/2000 | Collins et al. ......... | 156/345.29 |
| 6,109,206 A | * | 8/2000 | Maydan et al. ........ | 118/723 IR |

FOREIGN PATENT DOCUMENTS

EP 0838843 A2 * 4/1998

\* cited by examiner

*Primary Examiner*—Luz Alejandro-Mulero
(74) *Attorney, Agent, or Firm*—Townsend and Townsend and Crew LLP

(57) ABSTRACT

The present invention is directed to an upper chamber design of a plasma CVD chamber which provides more uniform conditions for forming thin CVD films on a substrate. Embodiments of the invention improve temperature control of the upper chamber and improve particle performance by reducing or minimizing the temperature fluctuations on the dome between the deposition and non-deposition cycles. In accordance with an aspect of the present invention, an apparatus for processing semiconductor substrates comprises a chamber defining a plasma processing region therein. The chamber includes a bottom, a side wall, and a dome disposed on top of the side wall. The dome has a substantially flat dome top. A top RF coil is disposed above the dome top, and has an outer loop which is larger in size than the substrates to be processed in the chamber. A cold plate is disposed above the top RF coil, and is larger in size than the substrates to be processed in the chamber.

21 Claims, 6 Drawing Sheets

UPPER CHAMBER FOR HIGH DENSITY PLASMA CVD

CROSS-REFERENCES TO RELATED APPLICATIONS

This application is related to concurrently filed, commonly assigned U.S. patent application Ser. No. 10/150,581 entitled HIGH DENSITY PLASMA CVD CHAMBER, the entire disclosure of which is incorporated herein by reference.

BACKGROUND OF THE INVENTION

This invention relates generally to semiconductor processing equipment and, more particularly, to a chemical vapor deposition chamber suitable for high density plasma processing.

Chemical vapor deposition (CVD) is a gas reaction process used in the semiconductor industry to form thin layers or films of desired materials on a substrate. Some high density plasma (HDP) enhanced CVD processes use a reactive chemical gas along with physical ion generation through the use of an RF generated plasma to enhance the film deposition by attraction of the positively charged plasma ions onto a negatively biased substrate surface at angles near the vertical to the surface, or at preferred angles to the surface by directional biasing of the substrate surface. One goal in the fabrication of integrated circuits (ICs) is to form very thin, yet uniform films onto substrates, at a high throughput. Many factors, such as the type and geometry of the power source and geometry, the gas distribution system and related exhaust, substrate heating and cooling, chamber construction, design, and symmetry, composition and temperature control of chamber surfaces, and material build up in the chamber, must be taken into consideration when evaluating a process system as well as a process which is performed by the system.

Some of the most widely used CVD films include tungsten, silicon dioxide, silicon nitride and polysilicon, although other CVD films suitable as insulators, dielectrics, conductors, semiconductors, superconductors and magnetics are known. The system of the present invention has been found to be particularly effective in forming thin films of doped and undoped silicon dioxide.

One problem encountered in IC fabrication is the difficulty associated with establishing a uniform plasma density over the entire substrate surface during processing. As substrate sizes increase, i.e., to 300 mm, single coil assemblies suffer wall losses and the like, thereby creating inefficient coupling of power into the plasma resulting in center peaked or cusped plasma profiles. The resulting deposition of material under non-uniform plasma densities results in films which are typically center thick or edge thick, and in either instance tend to be non-uniform.

BRIEF SUMMARY OF THE INVENTION

The present invention is directed to an upper chamber design of a plasma CVD chamber which provides more uniform conditions for forming thin CVD films on a substrate. Embodiments of the invention improve temperature control of the upper chamber and improve particle performance by reducing or minimizing the temperature fluctuations on the dome between the deposition and non-deposition cycles.

In accordance with one embodiment of the present invention, an apparatus for processing semiconductor substrates comprises a chamber defining a plasma processing region therein. The chamber includes a bottom, a side wall, and a dome disposed on top of the side wall. The dome has a substantially flat dome top. A top RF coil is disposed above the dome top, and has an outer loop which is larger in size than the substrates to be processed in the chamber. A cold plate is disposed above the top RF coil, and is larger in size than the substrates to be processed in the chamber. Typically a stack comprising a cold plate, a heater, and an RF insulator is disposed above the top RF coil. These features produce a more uniform plasma and provide improved center-to-edge gapfill uniformity.

In accordance with another embodiment of the present invention, an apparatus for processing semiconductor substrates comprises a chamber defining a plasma processing region therein. The chamber includes a bottom, a side wall, and a dome disposed on top of the side wall. The dome has a dome top. A top RF coil is disposed above the dome top. A ground shield is disposed adjacent a corner region of the dome between the dome top and a side portion of the dome, and comprises an aluminum block. In some embodiments, the aluminum block includes a heater embedded therein. A cooling element may be embedded in a heating member disposed adjacent the aluminum block on a side opposite from the dome. The use of the aluminum block reduces RF loss to ground as compared to the use of graphite by reducing eddy current, and improves RF coupling in the plasma.

In accordance with another embodiment of the present invention, an apparatus for processing semiconductor substrates comprises a chamber defining a plasma processing region therein. The chamber includes a bottom, a side wall, and a dome disposed on top of the side wall. The dome has a dome top. A top RF coil is disposed above the dome top. A side RF coil, a heating element, and a cooling element are disposed adjacent a side portion of the dome. The side RF coil is decoupled from the heating element and the cooling element. In some embodiments, the side RF coil, the heating element, and the cooling element are supported by and spaced from each other by an aluminum nitride block. Decoupling the temperature control aspect from the side RF coil allows the side RF coil to be spaced away from the dome, thereby reducing the capacitive coupling of the plasma.

In accordance with another embodiment of the present invention, an apparatus for processing semiconductor substrates comprises a chamber defining a plasma processing region therein. The chamber includes a bottom, a side wall, and a dome disposed on top of the side wall. The dome has a dome top. A top RF coil is disposed above the dome top. A cold plate is disposed above the top RF coil. A cooling system is coupled with the cold plate to circulate a cooling fluid to the cold plate. The cooling system includes a flow control device to adjust a flow rate of the cooling fluid to the cold plate in response to operating conditions inside the chamber. In some embodiments, the flow control device of the cooling system comprises a two-way valve and an adjustable metering valve connected in parallel between a fluid source and the cold plate. The two-way valve is normally closed and is open when there is a plasma inside the chamber. The metering valve is adjustable to set a minimum flow of cooling fluid to the cold plate. The cooling system may also be coupled with a side RF coil and a ground shield to circulate the cooling fluid to the side RF coil and the ground shield.

DETAILED DESCRIPTION OF THE INVENTION

Figure 1:
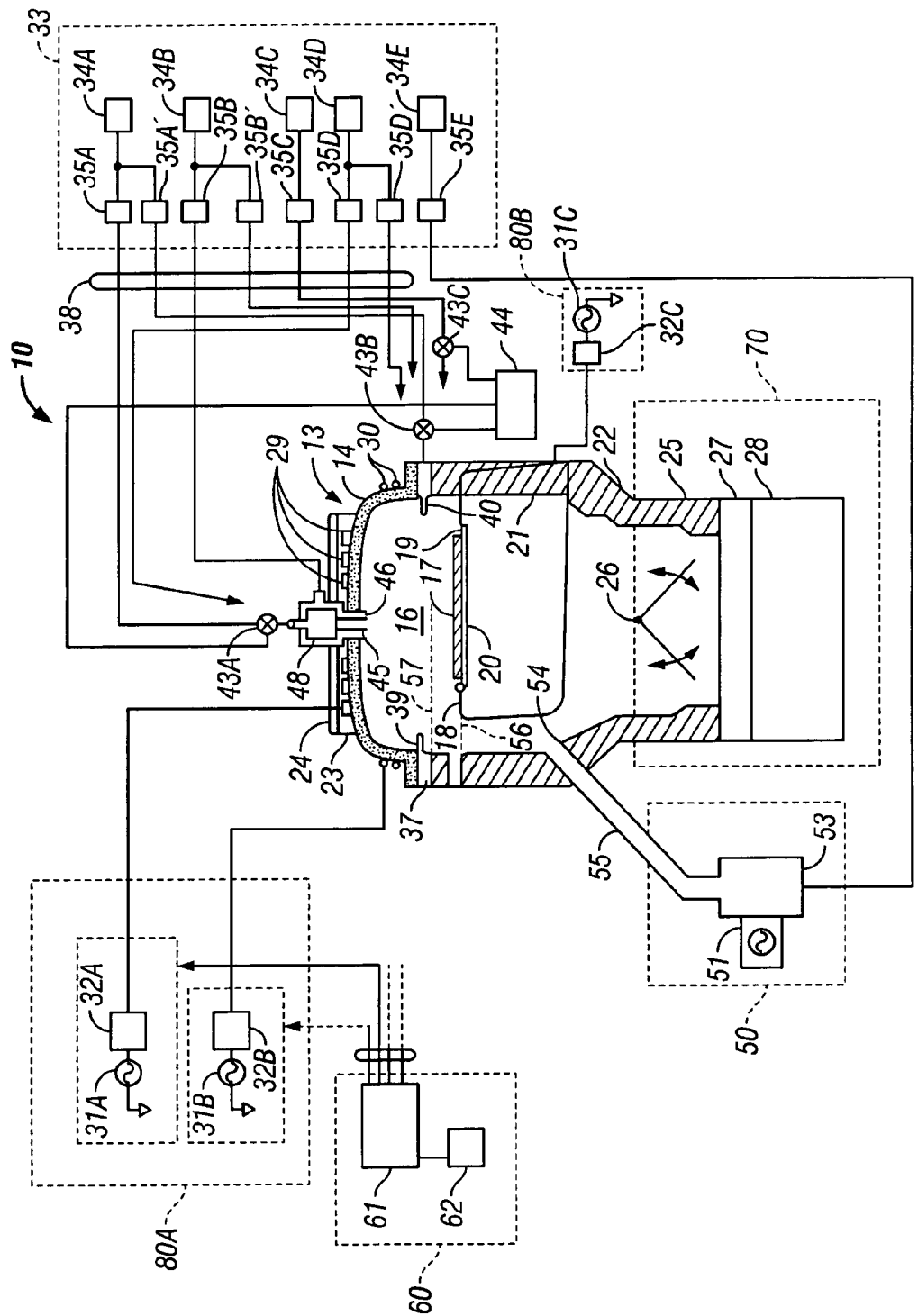
FIG. 1 is a simplified diagram of an embodiment of a high density plasma chemical vapor deposition (HDP-CVD) system according to the present invention.

FIG. 1 illustrates one embodiment of a high density plasma chemical vapor deposition (HDP-CVD) system 10 in which a dielectric layer can be deposited. System 10 includes a chamber 13, a vacuum system 70, a source plasma system 80A, a bias plasma system 80B, a gas delivery system 33, and a remote plasma cleaning system 50.

The upper portion of chamber 13 includes a dome 14, which is made of a ceramic dielectric material, such as aluminum oxide or aluminum nitride. Dome 14 defines an upper boundary of a plasma processing region 16. Plasma processing region 16 is bounded on the bottom by the upper surface of a substrate 17 and a substrate support 18.

A heater plate 23 and a cold plate 24 surmount, and are thermally coupled to, dome 14. Heater plate 23 and cold plate 24 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

Generally, exposure to the plasma heats a substrate positioned on substrate support 18. Substrate support 18 includes inner and outer passages (not shown) that can deliver a heat transfer gas (sometimes referred to as a backside cooling gas) to the backside of the substrate.

The lower portion of chamber 13 includes a body member 22, which joins the chamber to the vacuum system. A base portion 21 of substrate support 18 is mounted on, and forms a continuous inner surface with, body member 22. Substrates are transferred into and out of chamber 13 by a robot blade (not shown) through an insertion/removal opening (not shown) in the side of chamber 13. Lift pins (not shown) are raised and then lowered under the control of a motor (also not shown) to move the substrate from the robot blade at an upper loading position 57 to a lower processing position 56 in which the substrate is placed on a substrate receiving portion 19 of substrate support 18. Substrate receiving portion 19 includes an electrostatic chuck 20 that secures the substrate to substrate support 18 during substrate processing. In a preferred embodiment, substrate support 18 is made from an aluminum oxide or aluminum ceramic material.

Vacuum system 70 includes throttle body 25, which houses three-blade throttle valve 26 and is attached to gate valve 27 and turbo-molecular pump 28. It should be noted that throttle body 25 offers minimum obstruction to gas flow, and allows symmetric pumping, as described in co-pending, co-assigned U.S. patent application Ser. No. 08/574,839, filed Dec. 12, 1995, and which is incorporated herein by reference. Gate valve 27 can isolate pump 28 from throttle body 25, and can also control chamber pressure by restricting the exhaust flow capacity when throttle valve 26 is fully open. The arrangement of the throttle valve, gate valve, and turbo-molecular pump allow accurate and stable control of chamber pressures from between about 1 milli-Torr to about 2 Torr.

The source plasma system 80A includes a top coil 29 and side coil 30, mounted on dome 14. A symmetrical ground shield (not shown) reduces electrical coupling between the coils. Top coil 29 is powered by top source RF (SRF) generator 31A, whereas side coil 30 is powered by side SRF generator 31B, allowing independent power levels and frequencies of operation for each coil. This dual coil system allows control of the radial ion density in chamber 13, thereby improving plasma uniformity. Side coil 30 and top coil 29 are typically inductively driven, which does not require a complimentary electrode. In a specific embodiment, the top source RF generator 31A provides up to about 8,000 watts of RF power or higher at nominally 2 MHz and the side source RF generator 31B provides up to about 8,000 watts of RF power or higher at nominally 2 MHz. The operating frequencies of the top and side RF generators may be offset from the nominal operating frequency (e.g. to 1.7-1.9 MHz and 1.9-2.1 MHz, respectively) to improve plasma-generation efficiency.

A bias plasma system 80B includes a bias RF (BRF) generator 31C and a bias matching network 32C. The bias plasma system 80B capacitively couples substrate portion 17 to body member 22, which act as complimentary electrodes. The bias plasma system 80B serves to enhance the transport of plasma species (e.g., ions) created by the source plasma system 80A to the surface of the substrate. In a specific embodiment, bias RF generator provides up to about 8,000 watts of RF power or higher at 13.56 MHz.

RF generators 31A and 31B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 32A and 32B match the output impedance of generators 31A and 31B with their respective coils 29 and 30. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition. Other measures may also help stabilize a plasma. For example, the RF control circuit can be used to determine the power delivered to the load (plasma) and may increase or decrease the generator output power to keep the delivered power substantially constant during deposition of a layer.

Figure 2:
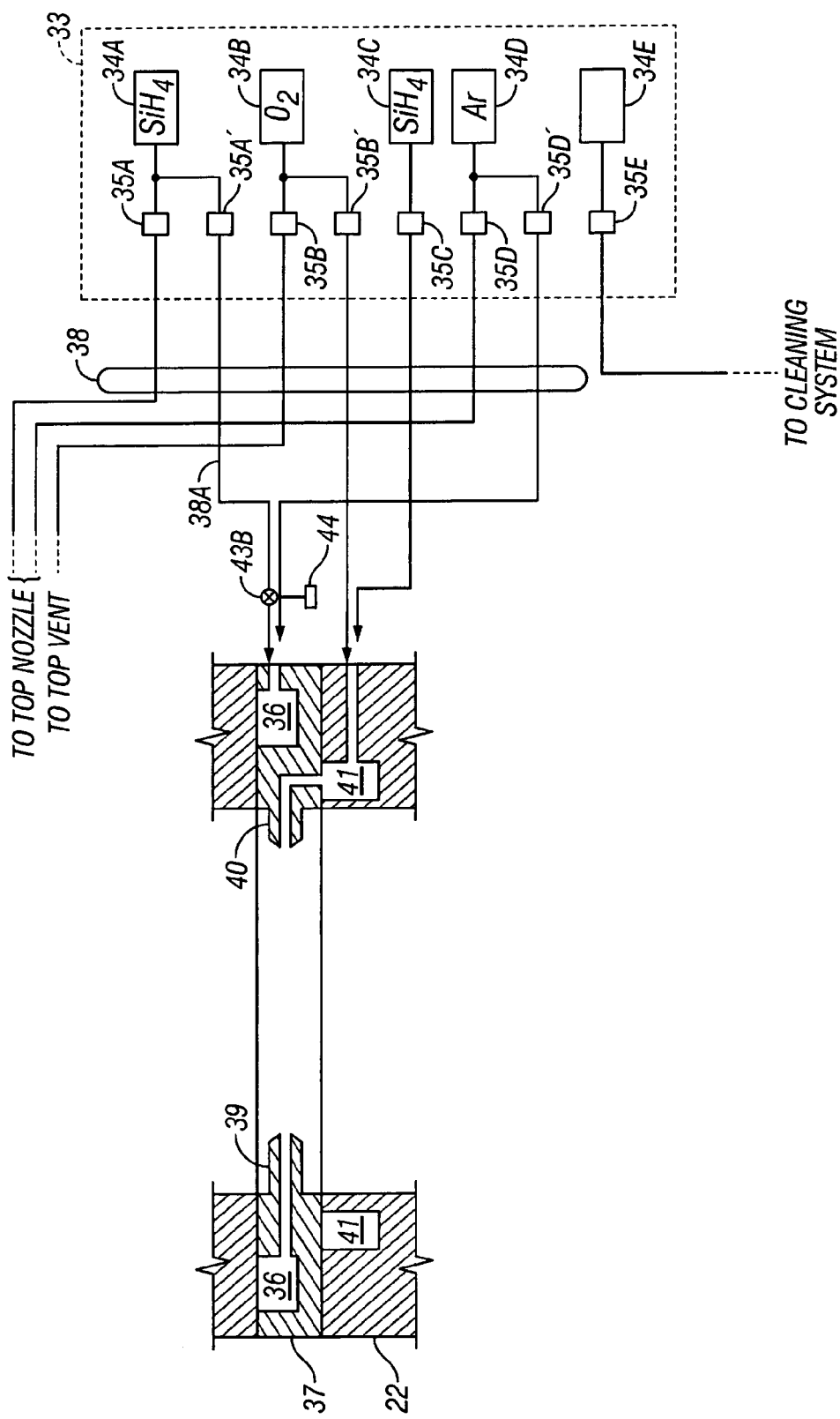
FIG. 2 is a simplified cross section of a gas ring that may be used in conjunction with the exemplary HDP-CVD system of FIG. 1.

A gas delivery system 33 provides gases from several sources, 34A-34F chamber for 30 processing the substrate via gas delivery lines 38 (only some of which are shown). As would be understood by a person of skill in the art, the actual sources used for sources 34A-34F and the actual connection of delivery lines 38 to chamber 13 varies depending on the deposition and cleaning processes executed within chamber 13. Gases are introduced into chamber 13 through a gas ring 37 and/or a top nozzle 45. FIG. 2 is a simplified, partial cross-sectional view of chamber 13 showing additional details of gas ring 37.

In one embodiment, first and second gas sources, 34A and 34B, and first and second gas flow controllers, 35A' and 35B', provide gas to ring plenum 36 in gas ring 37 via gas delivery lines 38 (only some of which are shown). Gas ring 37 has a plurality of gas nozzles 39 (only one of which is shown for purposes of illustration) that provides a uniform flow of gas over the substrate. Nozzle length and nozzle angle may be changed to allow tailoring of the uniformity profile and gas utilization efficiency for a particular process within an individual chamber. In one embodiment, gas ring 37 has 24 gas nozzles 39 made from an aluminum oxide ceramic.

Gas ring 37 also has a plurality of gas nozzles 40 (only one of which is shown), which in a preferred embodiment are co-planar with and the same in length as source gas nozzles 39, and in one embodiment receive gas from body plenum 41. Gas nozzles 39 and 40 are not fluidly coupled in some embodiments it is desirable not to mix gases before injecting the gases into chamber 13. In other embodiments, gases may be mixed prior to injecting the gases into chamber 13 by providing apertures (not shown) between body plenum 41 and gas ring plenum 36. In one embodiment, third and fourth gas sources, 34C and 34D, and third and fourth gas flow controllers, 35C and 35D', provide gas to body plenum via gas delivery lines 38. Additional valves, such as 43B (other valves not shown), may shut off gas from the flow controllers to the chamber.

In embodiments where flammable, toxic, or corrosive gases are used, it may be desirable to eliminate gas remaining in the gas delivery lines after a deposition. This may be accomplished using a 3-way valve, such as valve 43B, to isolate chamber 13 from delivery line 38A and to vent delivery line 38A to vacuum foreline 44, for example. As shown in FIG. 1, other similar valves, such as 43A and 43C, may be incorporated on other gas delivery lines. Such 3-way valves may be placed as close to chamber 13 as practical, to minimize the volume of the unvented gas delivery line (between the 3-way valve and the chamber). Additionally, two-way (on-off) valves (not shown) may be placed between a mass flow controller ("MFC") and the chamber or between a gas source and an MFC.

Referring again to FIG. 1, chamber 13 also has top nozzle 45 and top vent 46. Top nozzle 45 and top vent 46 allow independent control of top and side flows of the gases, which improves film uniformity and allows fine adjustment of the film's deposition and doping parameters. Top vent 46 is an annular opening around top nozzle 45. In one embodiment, first gas source 34A supplies source gas nozzles 39 and top nozzle 45. Source nozzle MFC 35A' controls the amount of gas delivered to source gas nozzles 39 and top nozzle MFC 35A controls the amount of gas delivered to top gas nozzle 45. Similarly, two MFCs 35B and 35B' may be used to control the flow of oxygen to both top vent 46 and oxidizer gas nozzles 40 from a single source of oxygen, such as source 34B. The gases supplied to top nozzle 45 and top vent 46 may be kept separate prior to flowing the gases into chamber 13, or the gases may be mixed in top plenum 48 before they flow into chamber 13. Separate sources of the same gas may be used to supply various portions of the chamber.

In the embodiment shown in FIGS. 1 and 2, remote microwave-generated plasma cleaning system 50 is provided to periodically clean deposition residues from chamber components. The cleaning system includes a remote microwave generator 51 that creates a plasma from a cleaning gas source 34E (e.g., molecular fluorine, nitrogen trifluoride, other fluorocarbons or equivalents) in reactor cavity 53. The reactive species resulting from this plasma are conveyed to chamber 13 through cleaning gas feed port 54 via applicator tube 55. The materials used to contain the cleaning plasma (e.g., cavity 53 and applicator tube 55) must be resistant to attack by the plasma. The distance between reactor cavity 53 and feed port 54 should be kept as short as practical, since the concentration of desirable plasma species may decline with distance from reactor cavity 53. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 20, do not need to be covered with a dummy wafer or otherwise protected, as may be required with an in situ plasma cleaning process.

Figure 3:
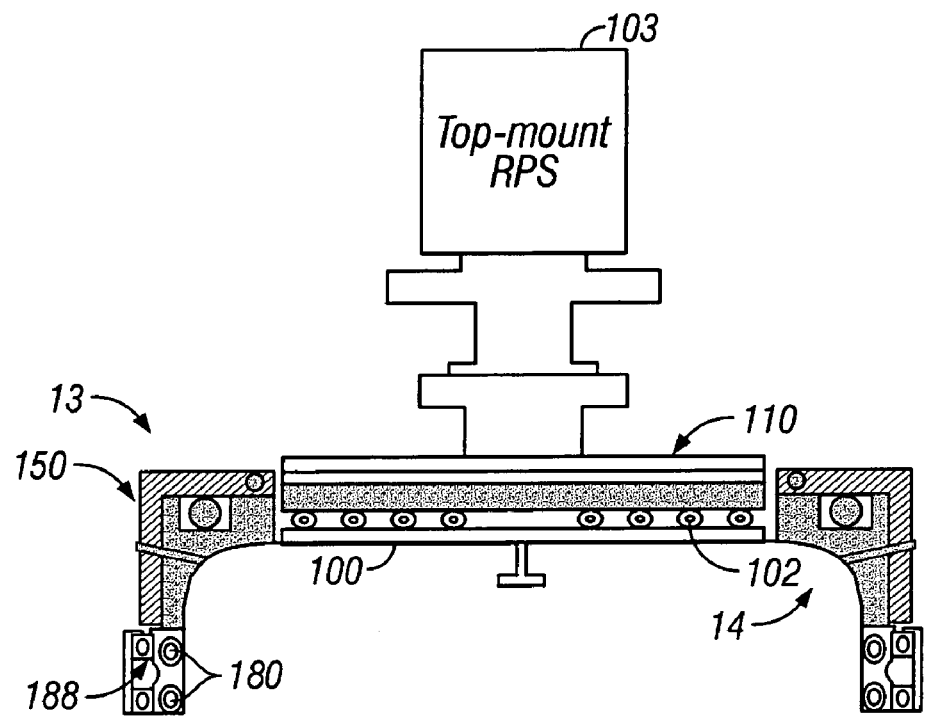
FIG. 3 is a simplified cross-sectional view of the upper chamber of the HDP-CVD system of FIG. 1 according to an embodiment of the present invention.

FIG. 3 shows details of the dome 14 and illustrates a number of features of the dome construction, coil arrangement, and ground shield design in the upper chamber of the chamber 13 according to a specific embodiment of the present invention. The dome 14 includes a dome top 100 having a large area that is generally flat. The RF coil coverage of the RF top coil 102 in the generally flat dome top 100 is wider than that of previous top coils. The RF top coil 102 reaches further to the edge of the dome top 100 than previous top coils. The generally flat dome top 100 and the wider RF coil coverage produce a more uniform plasma and provide, for instance, improved center-to-edge gapfill uniformity. For example, for processing a 12-inch (or about 300 mm) substrate, the RF top coil 102 coverage is equal to or larger than 12-inch, whereas previous top coils typically have a coverage of less than 12 inches (e.g., 10 inches). In one example, the RF coil coverage of the RF top coil 102 is about 14 inches (or about 350 mm) for processing a 12-inch substrate. This may be accomplished by adding one or more outside turns to the top coil. An inside turn may be removed without compromising uniformity since gapfill is typically good at the center. The removal of an inside turn can make room for a top mount clean feed into the chamber 13. Furthermore, the generally flat dome top 100 advantageously provides a larger surface area for heat transfer from the plasma via the dome top 100. Disposed above the dome top 100 is a heat conduction or cooling stack 110.

The remote plasma generator 103 is desirably a compact, self-contained unit that can be conveniently mounted on the chamber 13. One suitable unit is the ASTRON™ generator available from Applied Science and Technology, Inc. of Woburn, Mass. The ASTRON™ generator utilizes a low-field toroidal (LFT™) plasma to dissociate a process gas. In one example, the plasma dissociates a process gas including a fluorine-containing gas such as $NF_3$ and a carrier gas such as argon to generate free fluorine which is used to clean film deposits in the process chamber 13. The top-mounted remote plasma generator 103 replaces the microwave-generated plasma cleaning system 50 of the embodiment in FIGS. 1 and 2. In this embodiment, the oxygen is no longer introduced through the top vent 46 as in the embodiment in FIGS. 1 and 2, and instead is only introduced through the side nozzle into the chamber 13. An example of providing a top-mounted remote plasma generator on a process chamber of a substrate processing system is found in commonly assigned and copending U.S. patent application Ser. No. 09/561,325 entitled "Integration of Remote Plasma Generator with Semiconductor Processing Chamber," filed Apr. 28, 2000, the entire disclosure of which is incorporated herein by reference.

Figure 4:
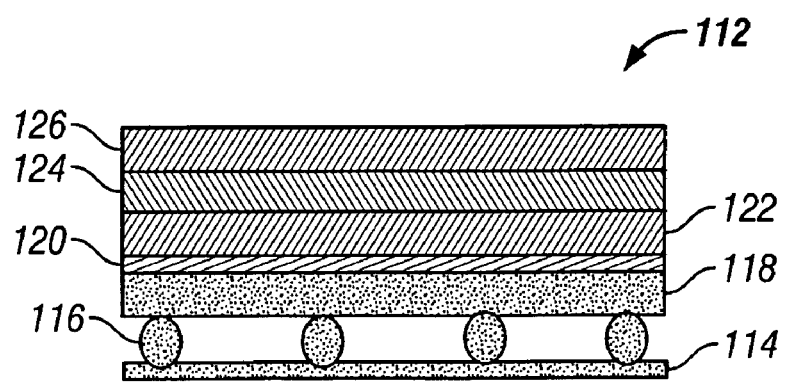
FIG. 4 is a simplified cross-sectional view of an example of an existing heat conduction stack.

FIG. 4 shows an example of a previously used heat conduction stack 112. A Chromerics™ heat transfer sheet 114 is disposed below the RF top coil 116. Stacked above the RF top coil 116 are an aluminum nitride RF insulator 118, a conducting plate 120, a heater plate 122, another conducting plate 124, and a cooling plate or cold plate 126.

Figure 5:
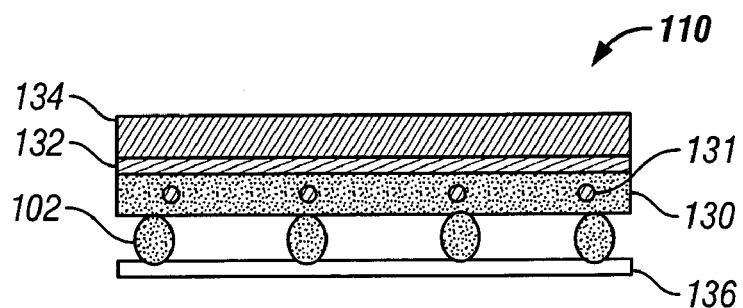
FIG. 5 is a simplified cross-sectional view of a heat conduction stack above-the dome top of the upper chamber of FIG. 3 according to an embodiment of the present invention.

In the exemplary embodiment as shown in FIG. 5, the heat conduction stack 110 integrates the heater into the aluminum nitride block to form an integrated heater-RF insulator block 130 disposed above the RF top coil 102. For instance, heater coils 131 can be embedded into the aluminum nitride block 130. A conducting plate 132 and a cooling plate 134 are stacked above the integrated heater-RF insulator block 130. The conducting plate 132 typically includes a graphite sheet. In some embodiments, the Chromerics™ heat transfer sheet is replaced by a heat transfer sheet 136 made of a silicone elastomer compound which is highly conformable and has a high thermal conductivity. A suitable material is the HeatPath™ thermal interface material available from Raychem Corporation, Menlo Park, Calif. Such a material is advantageously more compliant and has a higher thermal conductivity than Chromerics™. The thermal resistance between the dome 14 and the cooling plate 134 is reduced by employing the integrated heater-RF insulator block 130 and the improved thermal interface sheet 136 between the RF top coil 102 and the dome 14.

The increase in the area of the generally flat dome top 100 is complimented by a larger surface area for the cold plate 134. The larger cold plate 134 has more surface area available for heat transfer. The size of the cold plate 134 correlates generally with that of the RF top coil 102, and is larger than the substrate size. In a specific embodiment, the cold plate 134 has a coverage which is substantially the same as the coverage of the top RF coil 102.

Figure 6:
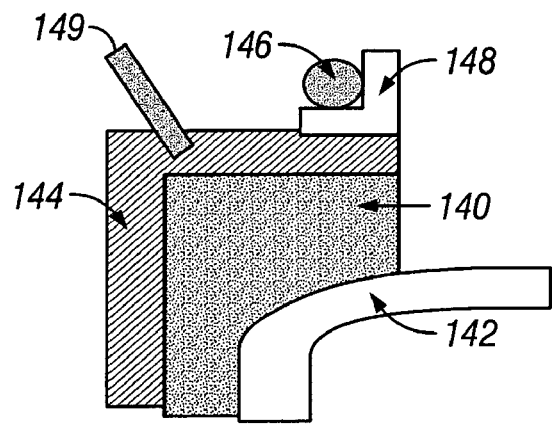
FIG. 6 is a simplified cross-sectional view of an existing ground shield.

FIG. 6 shows an example of a previously used ground shield design. In this example, a graphite block 140 is disposed between the dome 142 and the cooling/heating elements. Those elements include a heater 144 which is grounded, and a cooling element 146 which is typically a water cooling element supported by a bracket 148. A thermocouple 149 is in contact with the heater 144.

Figure 7:
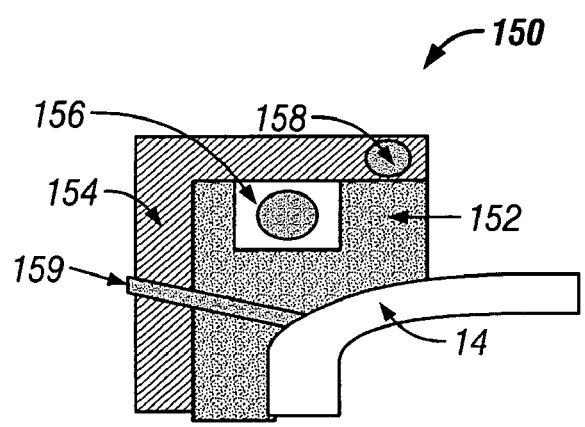
FIG. 7 is a simplified cross-sectional view of a ground shield in the upper chamber of FIG. 3 according to an embodiment of the present invention.

FIG. 7 shows an exemplary embodiment of an improved ground shield 150 which is disposed at the corner region of the dome 14 between the dome top and a side portion of the dome, as seen in FIG. 3. The interface between the dome 14 and the cooling/heating elements comprises an aluminum block 152, which reduces RF loss to ground as compared to the use of graphite by reducing eddy current and improves RF coupling in the plasma. In addition to the heater 154 disposed on the outside of the aluminum block 152, a heater 156 is desirably embedded in the aluminum block 152. A cooling element 158, which is typically a water cooling channel, is desirably embedded in the heater 154. This provides more surface area for cooling. A thermocouple 159 may extend through the ground shield 150 to contact the dome 14, which provides better temperature measurement, and thus quicker response time for temperature adjustment and control. The ground shield 150 allows the dome temperature at the corner region to be more precisely controlled than previous ground shields.

Figure 8:
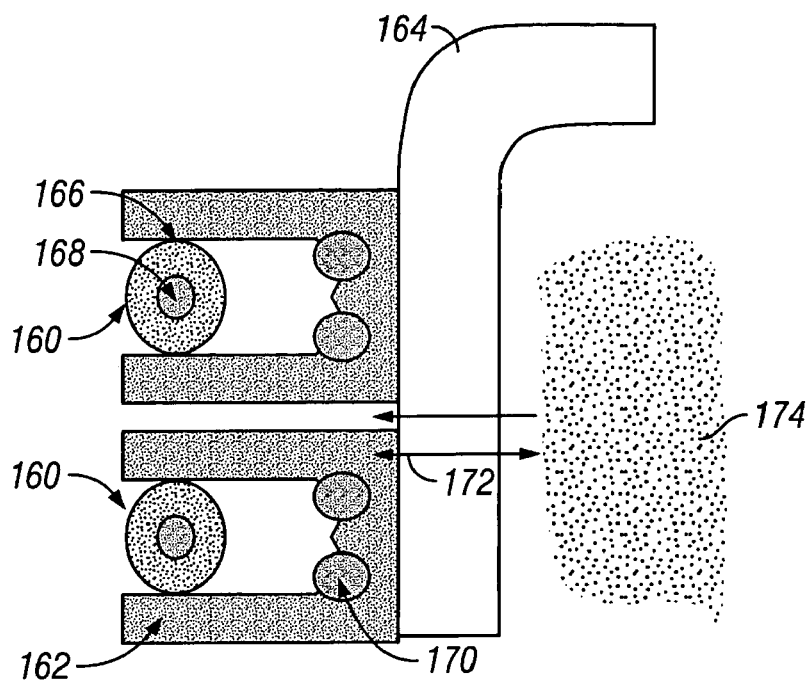
FIG. 8 is a simplified cross-sectional view of an existing side RF coil arrangement.

Another feature found in some embodiments of the upper chamber is the side coil arrangement. FIG. 8 shows a previously used configuration with RF side coils 160 supported by copper brackets 162 attached to the side of the dome 164. The side coils 160 are typically attached to the brackets 162 by silver brazing 166. Cooling elements 168 extend through the side coils 160. Heaters 170 are supported by the brackets 162. Heat flux 172 flows between the plasma 174 inside the chamber and the heating and cooling elements outside the chamber through the dome 164.

Figure 9:
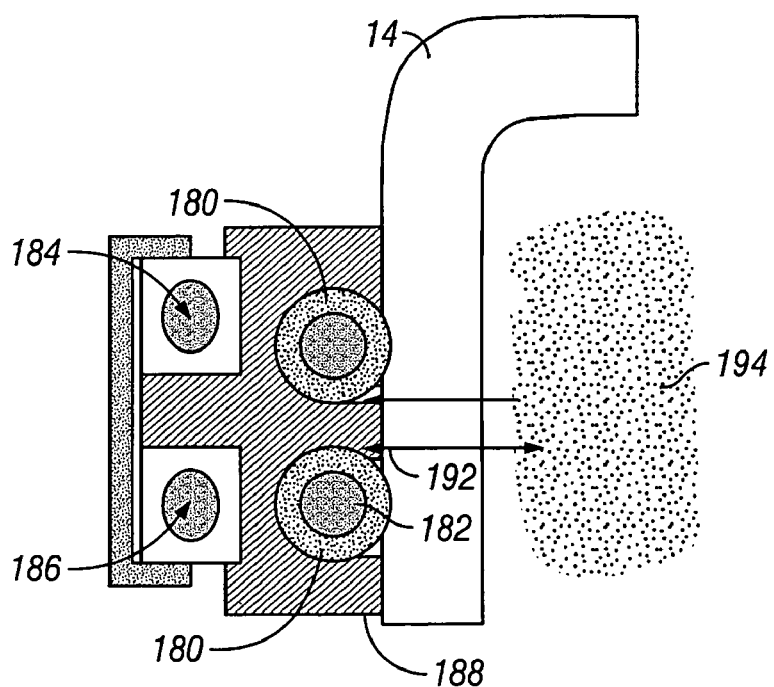
FIG. 9 is a simplified cross-sectional view of a side RF coil arrangement for the upper chamber of FIG. 3 according to an embodiment of the present invention.

In the exemplary embodiment of FIG. 9, the side RF coil 180 is disposed adjacent a side portion of the dome 14. The copper tubes 182 only carry RF currents, and are not involved in cooling or heating. The cooling element 184 and the heating element 186 are decoupled from the side RF coil 180. This decoupling improves the reliability of the side coil design. The decoupled cooling element 184 has increased surface area for improved heat transfer. The side RF coil 180, cooling element 184, and heater 186 may be supported by an aluminum nitride block or structure 188 which is thermally conductive and electrically insulative. Heat flux 192 flows between the plasma 194 inside the chamber and the heating and cooling elements outside the chamber through the dome 14. By decoupling the temperature control aspect from the side RF coil 180, the side RF coil 180 can be spaced away from the dome 14, reducing the capacitive coupling to the plasma 194. For instance, a dielectric spacer ring can be placed between the dome 14 and the side RF coil 180 to space the side RF coil 180 from the dome 14 by a desired amount.

Another feature of the present invention is an improved cooling scheme. To cool the dome in existing systems, the cold plate is typically cooled by circulating therethrough water at a generally constant temperature (e.g., about 80° F.). In the present cooling scheme, the temperature of the cooling fluid is reduced (e.g., to less than about 60° F., such as about 35-40° F.) to provide additional heat removal capacity. Moreover, the flow of the cooling fluid is adjustable to reduce the flow rate when there is no plasma in the chamber, thereby reducing the heat removal capacity and increasing the heater life.

Figure 10:
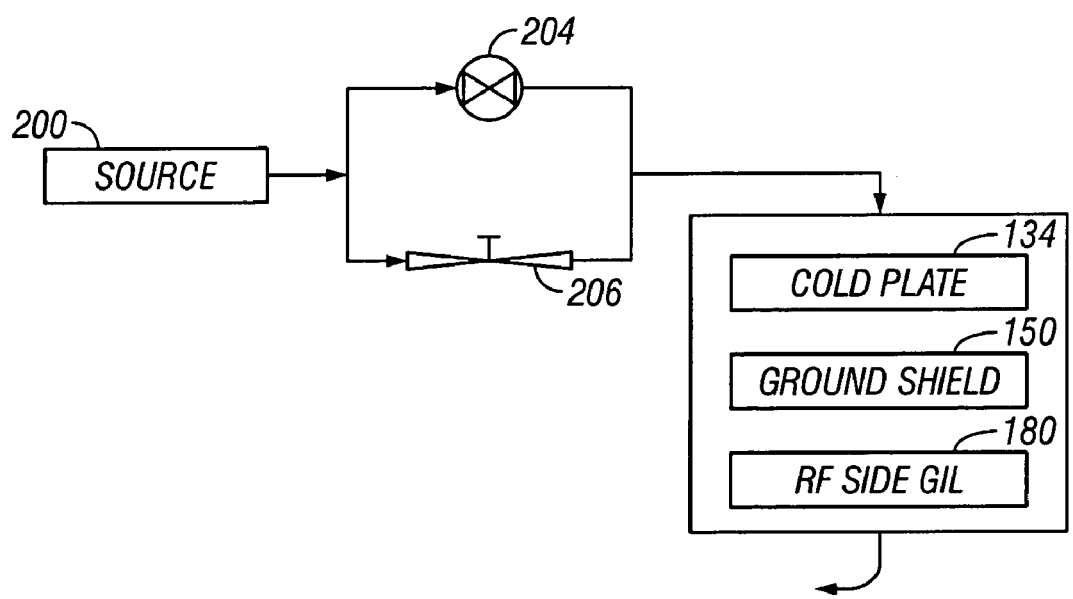
FIG. 10 is a schematic view of a cooling system for cooling the cold plate of the upper chamber of FIG. 3 according to an embodiment of the present invention.

FIG. 10 shows an example of providing flow control of the cooling fluid from a fluid source 200. The cooling fluid encounters parallel branches having a two-way valve 204 in one branch and a metering valve 206 in the other branch. The two-way valve 204 is normally closed when there is no processing and no plasma in the chamber. When there is a process with a plasma, the two-way valve 204 is switched to an open position. The metering valve 206 may be a needle valve or the like, and is manually adjustable to set some minimum flow of cooling fluid to the cold plate 134, the ground shield 150, and the RF side coil 180 as desired.

The above features improve temperature control of the dome 14 and improve particle performance, by reducing or minimizing the temperature fluctuations on the dome between the deposition and non-deposition cycles.

It is to be understood that the above description is intended to be illustrative and not restrictive. Many embodiments will be apparent to those of skill in the art upon reviewing the above description. By way of example, the present invention may extend to other types of CVD chambers and processes for processing different types of substrates. The scope of the invention should, therefore, be determined not with reference to the above description, but instead should be determined with reference to the appended claims along with their full scope of equivalents.

What is claimed is:

1. An apparatus for processing semiconductor substrates, the apparatus comprising:
   a chamber defining a plasma processing region therein, the chamber including a bottom, a side wall, and a dome disposed on top of the side wall, the dome having a substantially flat dome top;
   a top RF coil disposed above the dome top, the top RF coil having an outer loop which is larger in size than the substrates to be processed in the chamber;
   a cold plate disposed above the top RF coil, the cold plate being larger in size than the substrates to be processed in the chamber; and
   an RF insulator disposed between the top RF coil and the cold plate, the RF insulator having a heater disposed therein.

2. The apparatus of claim 1 wherein the top RF coil has a coverage of at least about 300 mm in diameter.

3. The apparatus of claim 1 further comprising a heat transfer sheet disposed between the top RF coil and the dome top.

4. The apparatus of claim 3 wherein the heat transfer sheet comprises a silicone elastomer compound.

5. The apparatus of claim 1 wherein the cold plate has a coverage which is substantially the same as a coverage of the top RF coil.

6. The apparatus of claim 1 wherein the heater comprises a heater coil.

7. The apparatus of claim 1 wherein the RF insulator comprises an aluminum nitride block.

8. The apparatus of claim 7 wherein the heater comprises heater coils embedded into the aluminum nitride block.

9. The apparatus of claim 1 further comprising a conducting plate disposed between the RF insulator and the cold plate, the conducting plate including graphite.

10. The apparatus of claim 1 further comprising a ground shield disposed adjacent a corner region of the dome between the dome top and a side portion of the dome, the ground shield comprising an aluminum block.

11. The apparatus of claim 1 further comprising a side RF coil, a heating element, and a cooling element which are disposed adjacent a side portion of the dome, the side RF coil being decoupled from the heating element and the cooling element.

12. The apparatus of claim 1 further comprising a flow of cooling fluid to the cold plate, and a flow control device to adjust a flow rate of the cooling fluid to the cold plate in response to operating conditions inside the chamber.

13. The apparatus of claim 1 further comprising:
   a ground shield disposed adjacent a corner region of the dome between the dome top and a side portion of the dome, the ground shield comprising an aluminum block.

14. The apparatus of claim 13 wherein the aluminum block includes a heater embedded therein.

15. The apparatus of claim 13 further comprising a cooling element embedded in a heating member disposed adjacent the aluminum block on a side opposite from the dome.

16. The apparatus of claim 13 further comprising:
   a side RE coil, a heating element, and a cooling element which are disposed adjacent a side portion of the dome, the side RE coil being decoupled from the heating element and the cooling element.

17. The apparatus of claim 16 wherein the side RE coil, the heating element, and the cooling element are supported by and spaced from each other by an aluminum nitride block.

18. The apparatus of claim 1 further comprising:
   a cooling system coupled with the cold plate to circulate a cooling fluid to the cold plate, the cooling system including a flow control device to adjust a flow rate of cooling fluid to the cold plate in response to operating conditions inside the chamber.

19. The apparatus of claim 18 wherein the flow control device of the cooling system comprises a two-way valve and an adjustable metering valve connected in parallel between a fluid source and the cold plate.

20. The apparatus of claim 19 wherein the two-way valve is normally closed and is open when there is a plasma inside the chamber, and wherein the metering valve is adjustable to set a minimum flow of cooling fluid to the cold plate.

21. The apparatus of claim 18 further comprising:
   a side RE coil disposed adjacent a side portion of the dome; and
   a ground shield disposed adjacent a corner region of the dome between the dome top and the side portion of the dome, the ground shield comprising an aluminum block;
   wherein the cooling system is coupled with the side RF coil and the ground shield to circulate the cooling fluid to the side RF coil and the ground shield, and wherein the flow control device of the cooling system adjusts the flow rate of cooling fluid to the side RF coil and the ground shield in response to operating conditions inside the chamber.

* * * * *